(12) United States Patent
Kim et al.

(10) Patent No.: US 11,699,599 B2
(45) Date of Patent: Jul. 11, 2023

(54) SUBSTRATE TRANSFER APPARATUS AND SUBSTRATE TREATING APPARATUS

(71) Applicant: SEMES CO., LTD., Cheonan-si (KR)

(72) Inventors: Byung Kyu Kim, Seoul (KR); Dukhyun Son, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 316 days.

(21) Appl. No.: 17/071,258

(22) Filed: Oct. 15, 2020

(65) Prior Publication Data

US 2021/0118702 A1  Apr. 22, 2021

(30) Foreign Application Priority Data

Oct. 17, 2019 (KR) .......................... 10-2019-0128918

(51) Int. Cl.
*H01L 21/67* (2006.01)
*H01L 21/687* (2006.01)
*B65G 47/90* (2006.01)
*H01L 21/677* (2006.01)

(52) U.S. Cl.
CPC ........ *H01L 21/67017* (2013.01); *B65G 47/90* (2013.01); *H01L 21/67742* (2013.01); *H01L 21/68707* (2013.01); *H01L 21/67196* (2013.01)

(58) Field of Classification Search
None
See application file for complete search history.

(56) References Cited

U.S. PATENT DOCUMENTS 7,798,764 B2 * 9/2010 Rice ...................... B25J 11/008
414/805
8,757,026 B2 * 6/2014 Barker .............. H01L 21/67742
74/490.01

FOREIGN PATENT DOCUMENTS

| JP | 2018-174259 A | 11/2018 | |
|---|---|---|---|
| KR | 101324210 B1 | 11/2013 | |
| KR | 10-2014-0017092 A | 2/2014 | |
| KR | 20140017092 A * | 2/2014 | ....... H01L 21/67742 |
| KR | 2014-0106897 A | 9/2014 | |
| KR | 2017-0055221 A | 5/2017 | |
| KR | 10187734 B1 | 7/2018 | |
| KR | 101982229 B1 | 5/2019 | |

OTHER PUBLICATIONS

Korean Office Action dated Dec. 21, 2020 issued in corresponding Korean Appln. No. 10-2019-0128918.

* cited by examiner

*Primary Examiner* — Michael S Lowe
(74) *Attorney, Agent, or Firm* — Harness, Dickey & Pierce, P.L.C.

(57) ABSTRACT

Disclosed is an apparatus for transferring a substrate. The apparatus includes a transfer robot, a linear rail unit including a movable plate on which the transfer robot is mounted and a running shaft on which the movable plate travels, and a particle diffusion prevention member that prevents diffusion of particles to the outside by maintaining a differential pressure between the movable plate and the running shaft.

15 Claims, 10 Drawing Sheets

SUBSTRATE TRANSFER APPARATUS AND SUBSTRATE TREATING APPARATUS

CROSS-REFERENCE TO RELATED APPLICATIONS

A claim for priority under 35 U.S.C. § 119 is made to Korean Patent Application No. 10-2019-0128918 filed on Oct. 17, 2019, in the Korean Intellectual Property Office, the entire contents of which are hereby incorporated by reference.

BACKGROUND

Embodiments of the inventive concept described herein relate to a substrate transfer apparatus and a substrate treating apparatus.

To manufacture semiconductor elements, desired patterns are formed on a substrate by performing various processes such as photolithography, etching, ashing, ion implantation, thin-film deposition, cleaning, and the like. To sequentially perform the various processes, the substrate has to be transferred. The substrate is transferred between units by a substrate transfer apparatus.

In general, a substrate treating process requires a clean state in which particles such as dust are removed. However, even when the interior of a chamber in which a process is preformed is in a clean state, a poor process may be caused by particles generated in a process of transferring a substrate. Particles may be mainly generated from an apparatus for transferring the substrate. More specifically, a large amount of particles may be generated due to friction between parts in a straight running shaft along which the substrate transfer apparatus moves.

SUMMARY

Embodiments of the inventive concept provide a substrate transfer apparatus and a substrate treating apparatus for minimizing a poor process caused by particles generated in a process of transferring a substrate.

In addition, embodiments of the inventive concept provide a substrate transfer apparatus and a substrate treating apparatus for minimizing the release of particles generated in a transfer robot to the outside.

The technical problems to be solved by the inventive concept are not limited to the aforementioned problems. Any other technical problems not mentioned herein will be clearly understood from the following description by those skilled in the art to which the inventive concept pertains.

According to an exemplary embodiment, a substrate transfer apparatus includes a transfer robot, a linear rail unit including a movable plate on which the transfer robot is mounted and a running shaft on which the movable plate travels, and a particle diffusion prevention member that prevents diffusion of particles to the outside by maintaining a differential pressure between the movable plate and the running shaft.

The particle diffusion prevention member may include a gas supply unit that supplies an inert gas into a space between the movable plate and the running shaft and an exhaust port that suctions air around the running shaft from below the running shaft.

The particle diffusion prevention member may further include a meandering gas passage provided in the space between the movable plate and the running shaft such that the inert gas supplied from the gas supply unit is released through the exhaust port.

The particle diffusion prevention member may further include a shielding cover member that prevents particles generated in the space between the movable plate and the running shaft and the inert gas supplied from the gas supply unit from diffusing to the outside.

The shielding cover member may install with the same length as the running shaft.

The shielding cover member may include a lower cover provided between the running shaft and the gas supply unit and an upper cover installed to surround an outer side of the running shaft and a top side of the running shaft.

The lower cover and the upper cover may provide a meandering gas passage in the space between the movable plate and the running shaft such that the inert gas supplied from the gas supply unit is released through the exhaust port.

The movable plate may include slots through which the lower cover and the upper cover pass.

The movable plate may include a first slot formed in a horizontal direction from a side surface of the movable plate, a second slot formed downward from an end of the first slot, a third slot formed downward from any position of the first slot that is spaced apart from the second slot by a predetermined distance, a fourth slot formed upward from a bottom surface of the movable plate and located between the second slot and the third slot, and an axial groove that is formed on the bottom surface of the movable plate and into which the running shaft is inserted.

The upper cover may include a first side plate located along a side surface of the running shaft, a first upper plate that extends from an upper end of the first side plate in the horizontal direction and that is located in the first slot, and first and second bending plates that extend downward from the first upper plate and that are located in the second slot and the third slot, respectively.

The lower cover may include a third bending plate and a fourth bending plate vertically located in the fourth slot and the axial groove.

The gas supply unit may be provided to supply the inert gas between the first bending plate and the third bending plate.

The exhaust port may be provided to be located under the running shaft.

According to an exemplary embodiment, a substrate treating apparatus includes a transfer chamber having a substrate transfer space surrounded by a floor and walls, a transfer robot provided in the substrate transfer space, a movable plate on which the transfer robot is mounted, a linear rail on which the movable plate travels, a gas supply port that is provided in the floor and that supplies an inert gas into a space between the movable plate and the linear rail, and an exhaust port that is provided in the floor and that suctions air around the linear rail from below the linear rail.

The linear rail may be mounted on a support block provided on the floor and may be spaced apart from the floor, and the exhaust port may be located under the linear rail spaced apart from the floor.

The substrate treating apparatus may further include a shielding cover member that is provided along the linear rail and that surrounds the linear rail.

The shielding cover member may provide a meandering gas passage in the space between the movable plate and the linear rail such that the inert gas supplied from the gas supply port is released through the exhaust port.

The gas supply port and the exhaust port may be provided at least one or more along the linear rail.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms such as first, second, and the like may be used to describe various components, but the components should not be limited by the terms. The terms may be used only for distinguishing one component from others. For example, without departing the scope of the inventive concept, a first component may be referred to as a second component, and similarly, the second component may also be referred to as the first component.

The terms of a singular form may include plural forms unless otherwise specified. Furthermore, in the drawings, the shapes and dimensions of components may be exaggerated for clarity of illustration.

Hereinafter, embodiments of the inventive concept will be described in detail with reference to the accompanying drawings.

Figure 1:
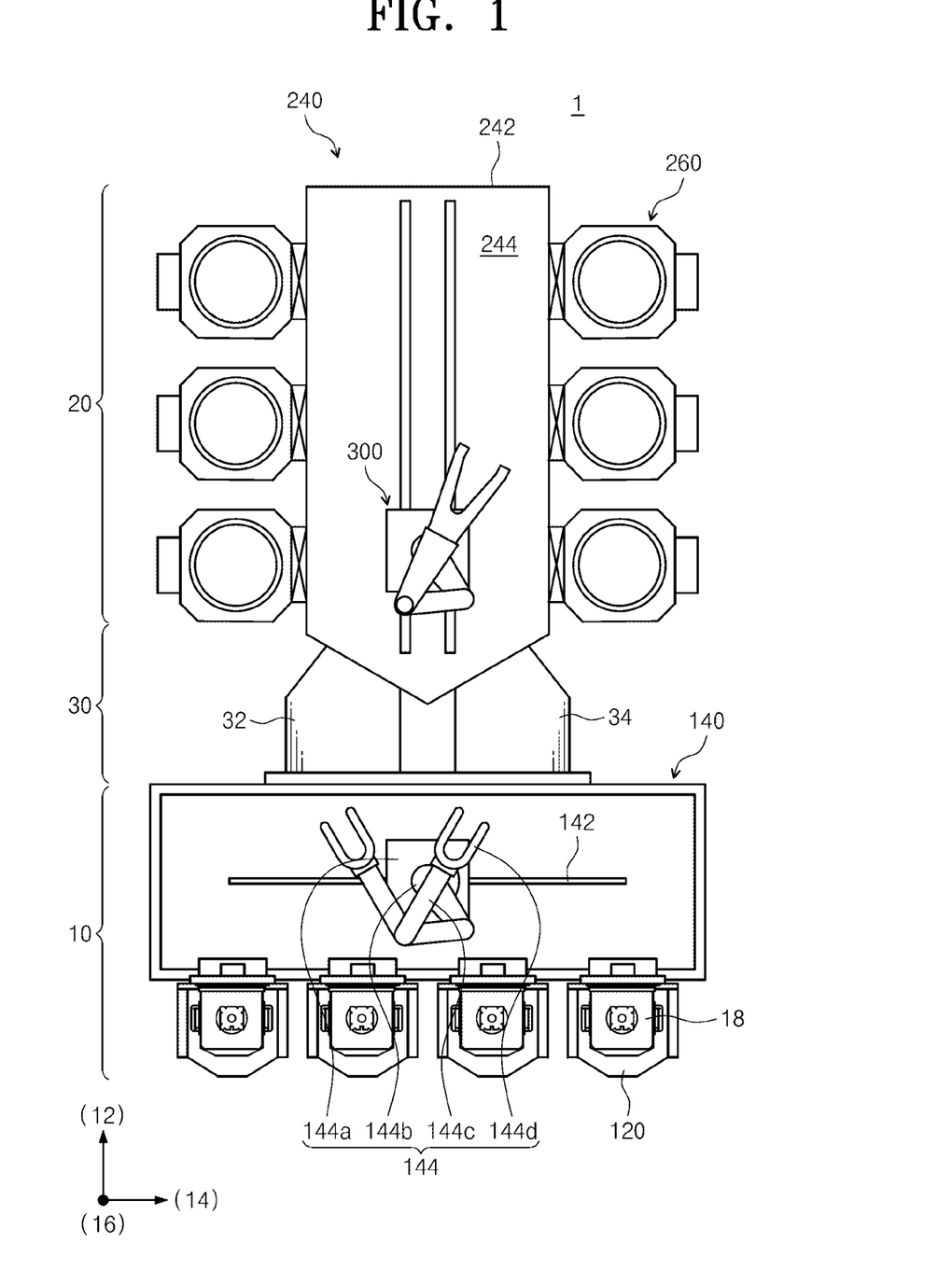
FIG. 1 is a plan view illustrating a substrate treating apparatus according to an embodiment of the inventive concept.

FIG. 1 is a plan view illustrating a substrate treating apparatus according to an embodiment of the inventive concept.

Referring to FIG. 1, the substrate treating apparatus 1 may include an index module 10, a load-lock module 30, and a process module 20.

The index module 10 may include load ports 120 and a transfer frame 140. The load ports 120, the transfer frame 140, and the process module 20 may be sequentially arranged in a row.

Hereinafter, a direction in which the load ports 120, the transfer frame 140, the load-lock module 30, and the process module 20 are arranged may be referred to as a first direction 12. When viewed from above, a direction perpendicular to the first direction 12 may be referred to as a second direction 14, and a direction perpendicular to the plane including the first direction 12 and the second direction 14 may be referred to as a third direction 16.

In the inventive concept, the load-lock module 30 and the process module 20 may be collectively referred to as a treatment module.

Cassettes 18, each of which has a plurality of substrates W received therein, may be seated on the load ports 120. The load ports 120 may be disposed in a row along the second direction 14. FIG. 1 illustrates one example that the index module 10 includes four load ports 120. However, the number of load ports 120 may be increased or decreased depending on conditions such as process efficiency and footprint of the process module 20.

Each of the cassettes 18 may have slots (not illustrated) that are formed therein to support the edges of the substrates W. The slots may be arranged in the third direction 16, and the substrates W may be stacked one above another with a spacing gap therebetween along the third direction 16 in the cassette 18. A front opening unified pod (FOUP) may be used as the cassette 18.

In the load ports 120 on which the cassettes 18 are seated and the transfer frame 140 including an index robot 144 for transferring the substrates W between the cassettes 18 seated on the load ports 120 and the treatment module, the load ports 120 and the transfer frame 140 may be arranged in the first direction 12.

The transfer frame 140 may transfer the substrates W between the cassettes 18 seated on the load ports 120 and the load-lock module 30. An index rail 142 and the index robot 144 may be provided in the transfer frame 140. The index rail 142 may be disposed such that the lengthwise direction thereof is parallel to the second direction 14. The index robot 144 may be provided on the index rail 142 and may rectilinearly move along the index rail 142 in the second direction 14. The index robot 144 may include a base 144a, a body 144b, index arms 144c, and hands 144d. The base 144a may be movable along the index rail 142. The body 144b may be coupled to the base 144a. The body 144b may be movable on the base 144a along the third direction 16. Furthermore, the body 144b may be rotatable on the base 144a. The index arms 144c may be coupled to the body 144b and may be movable forward and backward relative to the body 144b. The index arms 144c may be individually driven. The index arms 144c may be stacked one above another with a spacing gap therebetween along the third direction 16. Some of the index arms 144c may be used to transfer the substrates W from the process module 20 to the cassettes 18, and the other index arms 144c may be used to transfer the substrates W from the cassettes 18 to the process module 20. Accordingly, particles generated from the substrates W that are to be treated may be prevented from adhering to the treated substrates W in a process in which the index robot 144 transfers the substrates W between the cassettes 18 and the process module 20.

The load-lock module 30 may be disposed between the transfer frame 140 and a transfer unit 240. The load-lock module 30 may replace an atmospheric atmosphere of the index module 10 with a vacuum atmosphere of the process module 20 for the substrates W to be transferred to the process module 20, or may replace the vacuum atmosphere of the process module 20 with the atmospheric atmosphere of the index module 10 for the substrates W to be transferred to the index module 10. The load-lock module 30 may provide a space in which the substrates W stay before transferred between the transfer unit 240 and the transfer frame 140. The load-lock module 30 may include a load-lock chamber 32 and an unload-lock chamber 34.

The load-lock chamber 32 may provide a space in which the substrate W to be transferred from the index module 10 to the process module 20 temporarily stays. In a standby state, the load-lock chamber 32 may maintain an atmospheric atmosphere and may be closed to the process module 20, but may be open to the index module 10. When the substrate W is placed in the load-lock chamber 32, the interior space of the load-lock chamber 32 may be sealed from the index module 10 and the process module 20. Thereafter, the atmospheric atmosphere in the load-lock chamber 32 may be replaced with a vacuum atmosphere, and the load-lock chamber 32 may be open to the process module 20 in the state of being closed to the index module 10.

The unload-lock chamber 34 may provide a space in which the substrate W to be transferred from the process module 20 to the index module 10 temporarily stays. In a standby state, the unload-lock chamber 34 may maintain a vacuum atmosphere and may be closed to the index module 10, but may be open to the process module 20. When the substrate W is placed in the unload-lock chamber 34, the interior space of the unload-lock chamber 34 may be sealed from the index module 10 and the process module 20. Thereafter, the vacuum atmosphere in the unload-lock chamber 34 may be replaced with an atmospheric atmosphere, and the unload-lock chamber 34 may be open to the index module 10 in the state of being closed to the process module 20.

The process module 20 may include the transfer unit 240 and a plurality of process chambers 260.

The process chambers 260 may perform a process of treating the substrate W using plasma. According to an embodiment, the substrate treating process may be an etching process. Alternatively, the process performed in the process chambers 260 may be a process of treating the substrate W using a gas other than plasma.

The transfer unit 240 may transfer the substrate W between the load-lock chamber 32, the unload-lock chamber 34, and the plurality of process chambers 260. The transfer unit 240 may include a transfer chamber 242 and a substrate transfer apparatus 300.

The transfer chamber 242 may have a rectangular shape. Selectively, the transfer chamber 242 may have various shapes. The plurality of process chambers 260 may be located on opposite sides of the transfer chamber 242. A transfer space 244 for transferring the substrate W may be provided in the transfer chamber 242. The transfer space 244 may be implemented with a vacuum environment.

Figure 2:
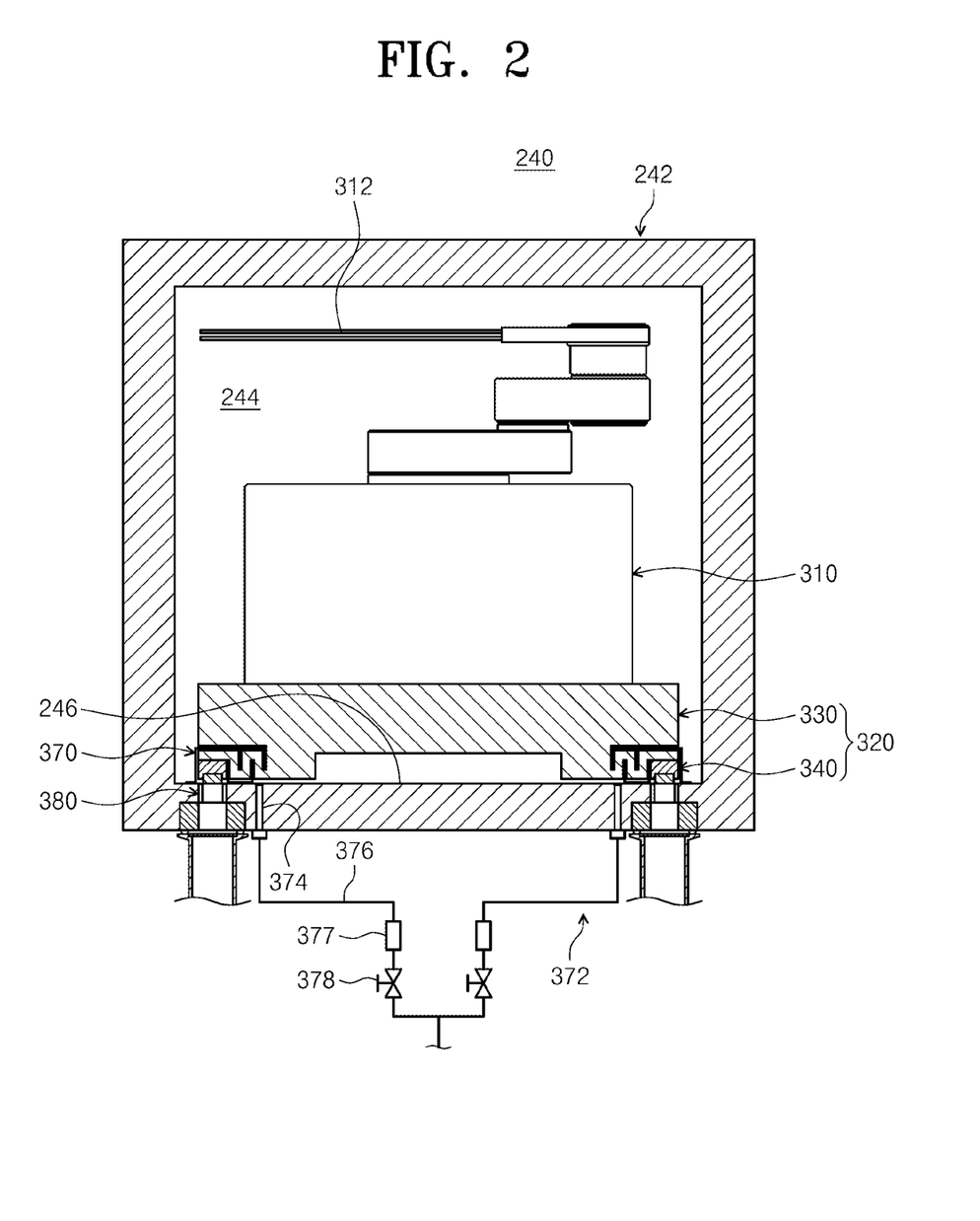
FIG. 2 is a sectional view illustrating a transfer chamber in which a substrate transfer apparatus is installed.
Figure 3:
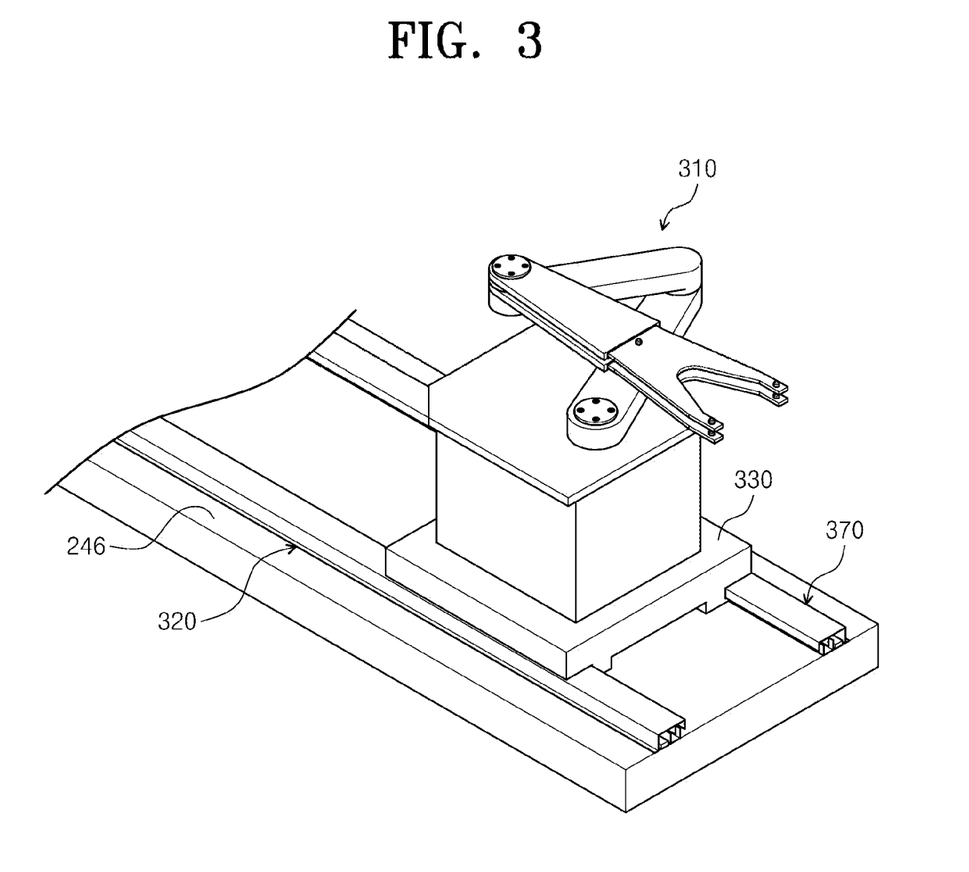
FIG. 3 is a perspective view illustrating the substrate transfer apparatus.
Figure 4A:
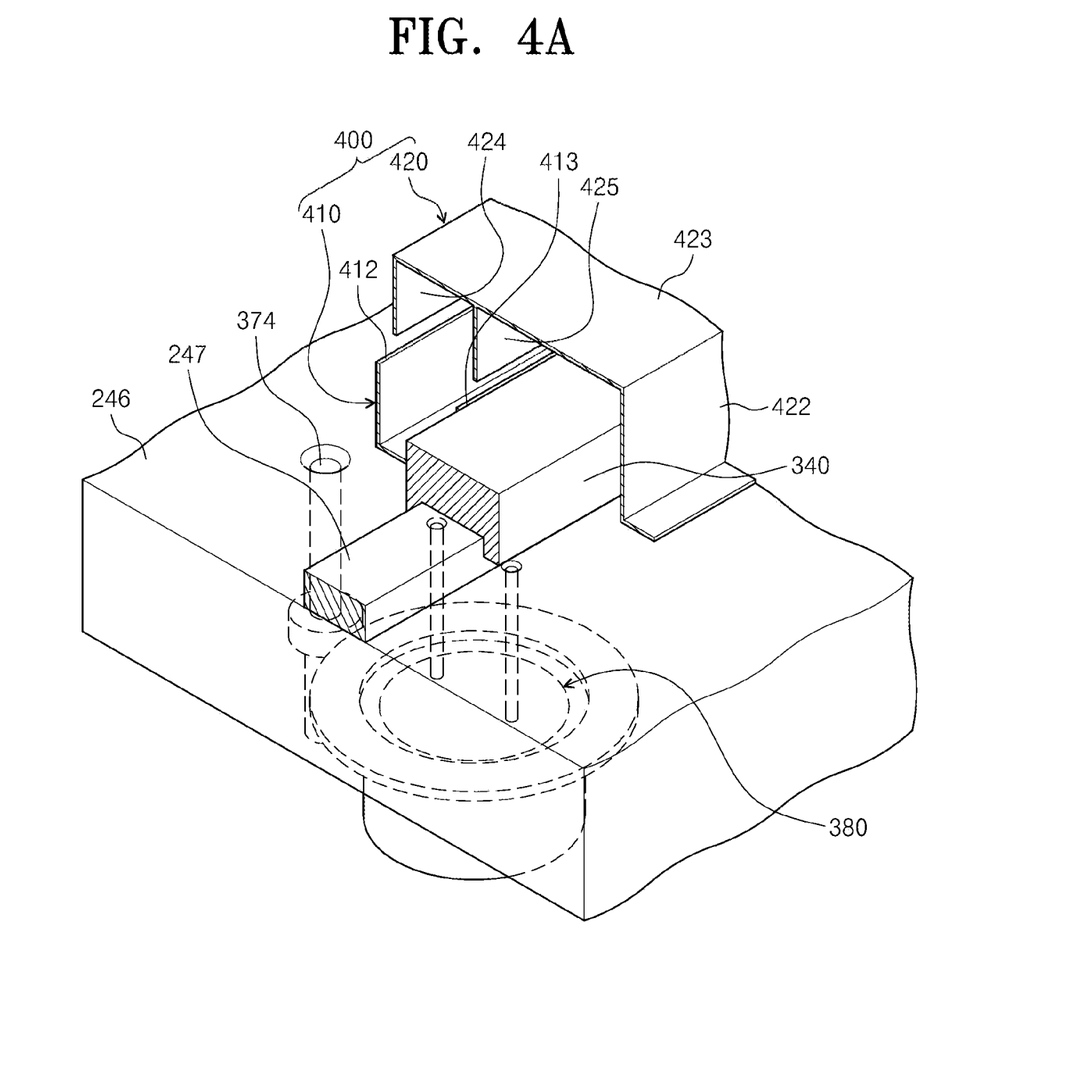
FIGS. 4A and 4B are views illustrating a linear rail unit and a particle diffusion prevention member.
Figure 4B:
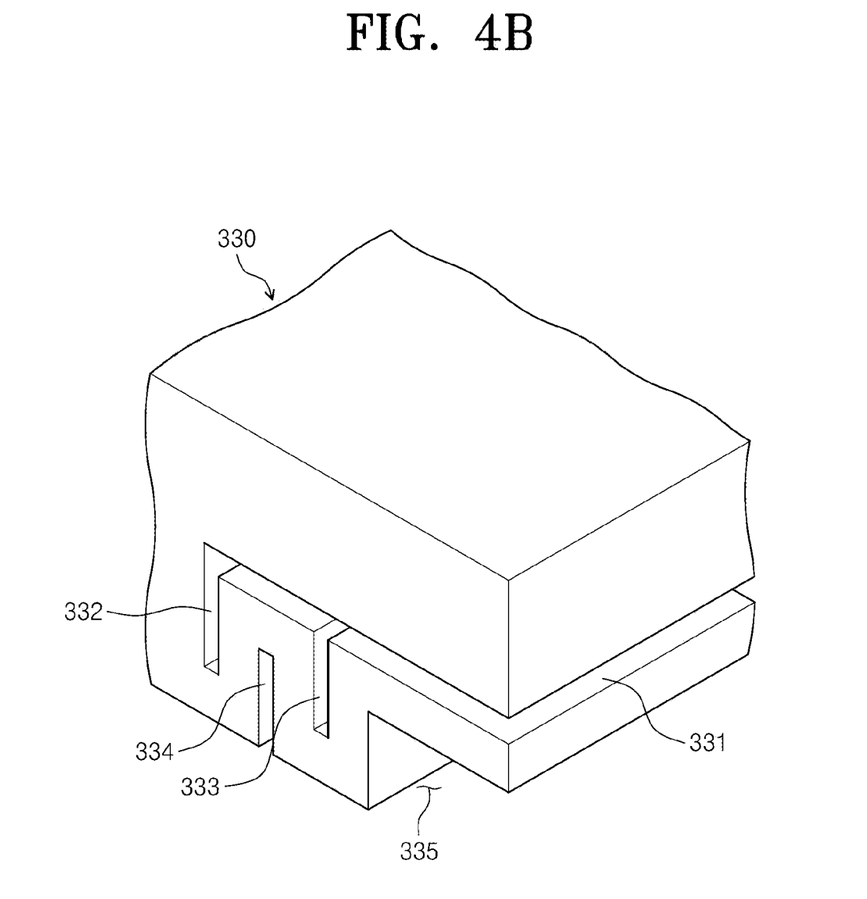

FIG. 2 is a sectional view illustrating the transfer chamber in which the substrate transfer apparatus is installed. FIG. 3 is a perspective view illustrating the substrate transfer apparatus. FIGS. 4A and 4B are views illustrating a linear rail unit and a particle diffusion prevention member.

Referring to FIGS. 2 to 4B, the substrate transfer apparatus 300 may include a transfer robot 310, the linear rail unit 320, and the particle diffusion prevention member 370. Here, the linear rail unit 320 may correspond to a linear moving mechanism that allows the transfer robot 310 to linearly move along the lengthwise direction of the transfer space 244. For example, the linear rail unit 320 may be a linear motor device including a stator and a movable element.

The transfer robot 310 may transfer the substrate W in the transfer space 244. The transfer robot 310 may be located so as to be movable along the lengthwise direction of the transfer chamber 242. The transfer robot 310 may have a plurality of hands 312 that are movable in the horizontal and vertical directions and are movable forward or backward or rotatable on the horizontal plane. Each of the hands 312 may be independently driven, and the substrate W may be seated on the hand 312 in a horizontal state. The hand 312 may be provided in various shapes. In an embodiment, the hand 312 may be provided in a "Y" shape to facilitate the transfer of the substrate W and other member(s) into or out of other component(s). In this embodiment, it has been exemplified that the hand 312 has a "Y" shape. However, the hand 312 may be provided in various shapes such as an "I" shape.

The linear rail unit 320 may include a movable plate 330 on which the transfer robot 310 is mounted and running shafts 340 corresponding to linear rails on which the movable plate 330 travels. The linear rail unit 320 may be provided parallel to the first direction 12 that corresponds to the lengthwise direction of the transfer chamber 242.

The particle diffusion prevention member 370 may serve to prevent diffusion of particles to the outside by maintaining differential pressures between the movable plate 330 and the running shafts 340.

The particle diffusion prevention member 370 may include gas supply units 372, exhaust ports 380, and shielding cover members 400.

The gas supply units 372 may include gas supply holes 374 for supplying an inert gas into spaces between the movable plate 330 and the running shafts 340 and gas supply lines 376 connected to the gas supply holes 374. The gas supply lines 376 may each be provided with a regulator 377 and a valve 378 for adjusting pressure. The regulators 377 and the valves 378 may adjust the flow rate of the inert gas supplied into the spaces between the movable plate 330 and the running shafts 340 and the pressure in the transfer space 244.

The exhaust ports 380 may be provided to suction air around the running shafts 340 from below the running shafts 340. Predetermined exhaust pressure may be provided in the exhaust ports 380. The exhaust ports 380 may be disposed adjacent to the gas supply holes 374. The running shafts 340 may be mounted on support blocks 247 provided on a floor 246 of the transfer chamber 242 and may be located to be spaced apart from the floor 246, and the exhaust ports 380 may be located under the running shafts 340 spaced apart from the floor 246. The exhaust ports 380 may be located adjacent to the bottoms of the running shafts 340 from which the largest amount of particles are generated in a process in which the substrate transfer apparatus 300 moves, thereby minimizing contamination of the transfer chamber 242 by particles.

Figure 5A:
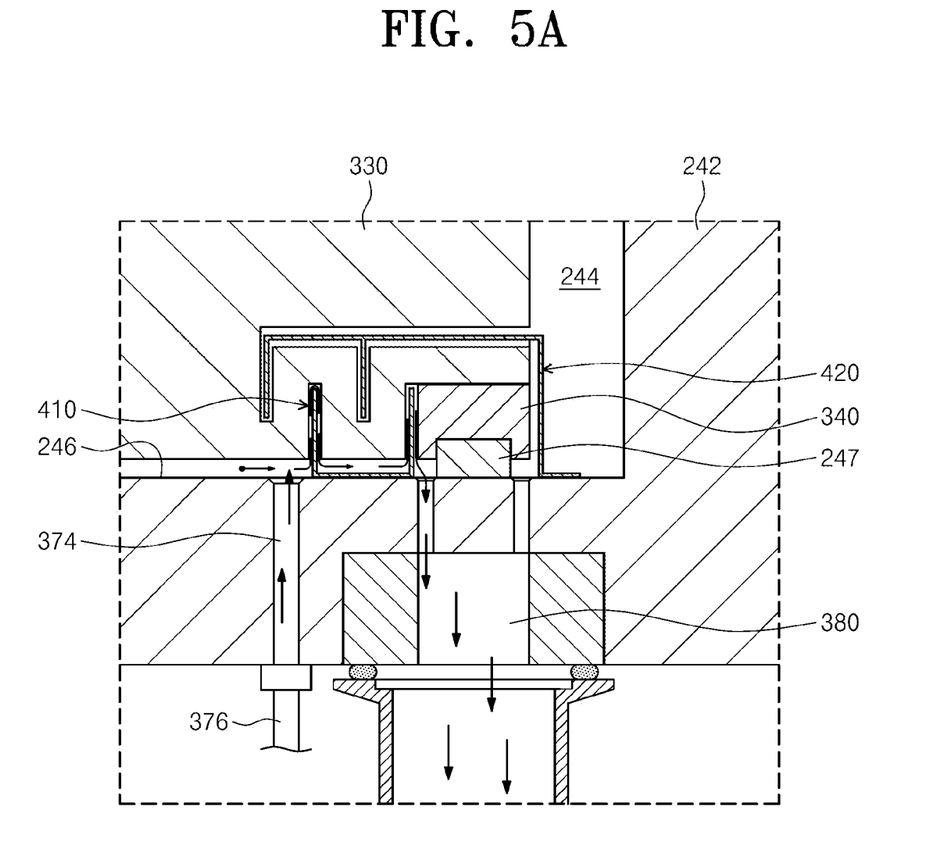
FIGS. 5A and 5B are views illustrating a flow of an inert gas between a movable plate and a running shaft.
Figure 5B:
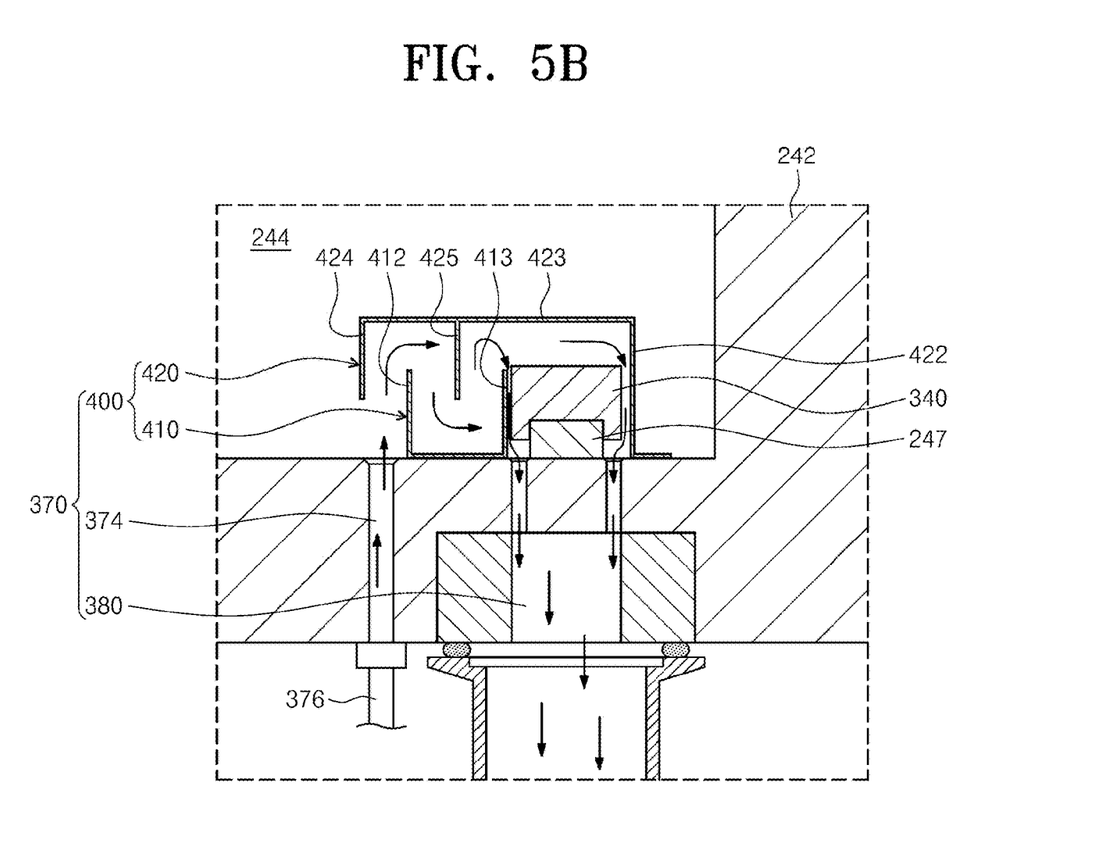

As illustrated in FIGS. 5A and 5b, the shielding cover members 400 of the particle diffusion prevention member 370 may provide meandering gas passages in the spaces between the movable plate 330 and the running shafts 340 such that the inert gas supplied from the gas supply holes 374 is released through the exhaust ports 380. The shielding cover members 400 may prevent particles generated from the spaces between the movable plate 330 and the running shafts 340 and the inert gas supplied from the gas supply units 372 from diffusing to the outside.

The shielding cover members 400 may have the same length as the running shafts 340. According to an embodiment, each of the shielding cover members 400 may include a lower cover 410 and an upper cover 420. The lower cover 410 may be provided between the running shaft 340 and the gas supply hole 374, and the upper cover 420 may be provided to surround an outer side of the running shaft 340 and a top side of the running shaft 340.

The upper cover 420 may include a first side plate 422 located along a side surface of the running shaft 340, a first upper plate 423 extending from an upper end of the first side plate 422 in a horizontal direction, and first and second bending plates 424 and 425 extending downward from the first upper plate 423. The first bending plate 424 and the second bending plate 425 may be spaced apart from each other by a predetermined distance.

The lower cover 410 may include a third bending plate 412 and a fourth bending plate 413 that vertically extending upward from opposite ends of a fixed plate 411 fixed to the floor 246. The fourth bending plate 413 may be located adjacent to an inner side of the running shaft 340.

The movable plate 330 may include slots through which the lower cover 410 and the upper cover 420 pass when the movable plate 330 moves along the running shaft 340. The movable plate 330 may include a first slot 331 formed in the horizontal direction from a side surface of the movable plate 330, a second slot 332 formed downward from an end of the first slot 331, a third slot 333 formed downward from any position of the first slot 331 that is spaced apart from the second slot 332 by a predetermined distance, a fourth slot 334 formed upward from a bottom surface of the movable plate 330 and located between the second slot 332 and the third slot 333, and an axial groove 335 that is formed on the bottom surface of the movable plate 330 and into which the running shaft 340 is inserted.

The third bending plate 412 of the lower cover 410 may be located in the fourth slot 334, and the fourth bending plate 413 may be located in the axial groove 335. The first upper plate 423 of the upper cover 420 may be located in the first slot 331, the first bending plate 424 may be located in the second slot 332, and the second bending plate 425 may be located in the third slot 333.

FIGS. 5A and 5B are views illustrating a flow of the inert gas between the movable plate 330 and the running shaft 340.

As illustrated in FIG. 5A, in a state in which the movable plate 330 is located over the gas supply unit 372 and the exhaust port 380, the inert gas may be moved into the space between the movable plate 330 and the running shaft 340 through the gap between the bottom surface of the movable plate 330 and the lower cover 410 and may be released to the exhaust port 380.

As illustrated in FIG. 5B, in a state in which the movable plate 330 deviates from above the gas supply unit 372 and the exhaust port 380, the inert gas may pass through the meandering gas passage provided by the upper cover 420 and the lower cover 410 and may be released to the exhaust port 380 located under the running shaft 340.

As described above, particles may be smoothly released from the left/right sides of the running shaft 340, and a predetermined differential pressure may be maintained. Thus, diffusion of the particles may be prevented.

Figure 6:
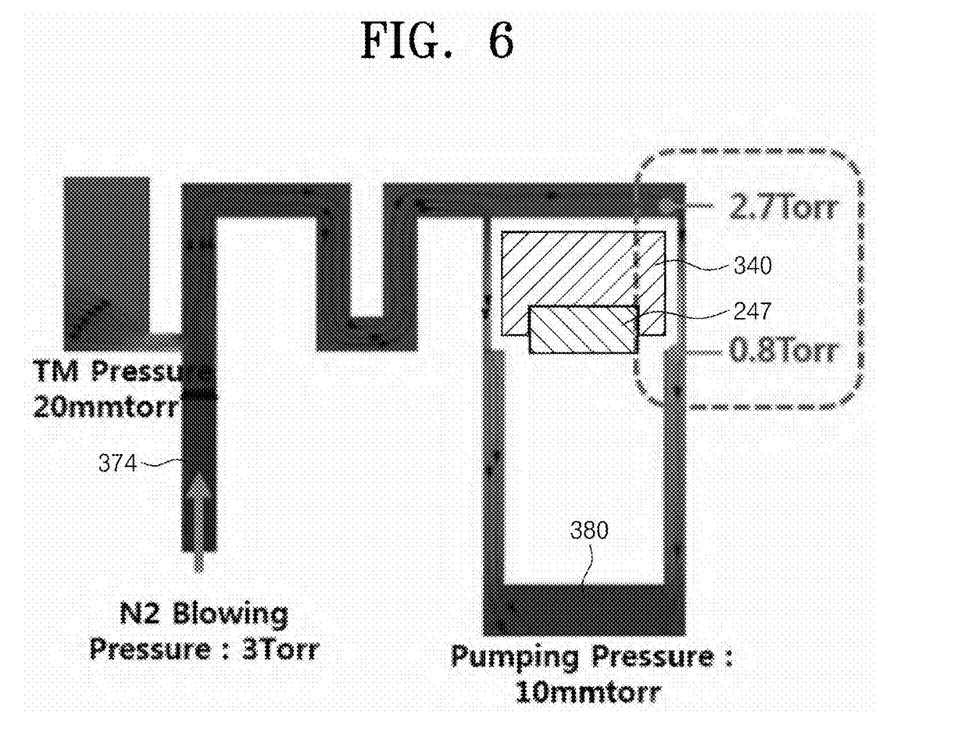
FIG. 6 illustrates a simulation result showing a pressure difference between an upper side and a lower side of the running shaft.

FIG. 6 illustrates a simulation result showing a pressure difference between an upper side and a lower side of the running shaft.

It can be seen that a differential pressure of 1.9 torr is formed between the upper side and the lower side of the running shaft 340 by the particle diffusion prevention member 370 as illustrated in FIG. 6.

As described above, particles around the running shaft 340 may be released to the exhaust port 380 together with the inert gas supplied through the gas supply hole 374. Furthermore, the shielding structure formed by the upper cover 420 and the lower cover 410 may divide the space in which the running shaft 340 is located from the transfer space 244, thereby preventing diffusion of particles into the transfer space 244.

Figure 7:
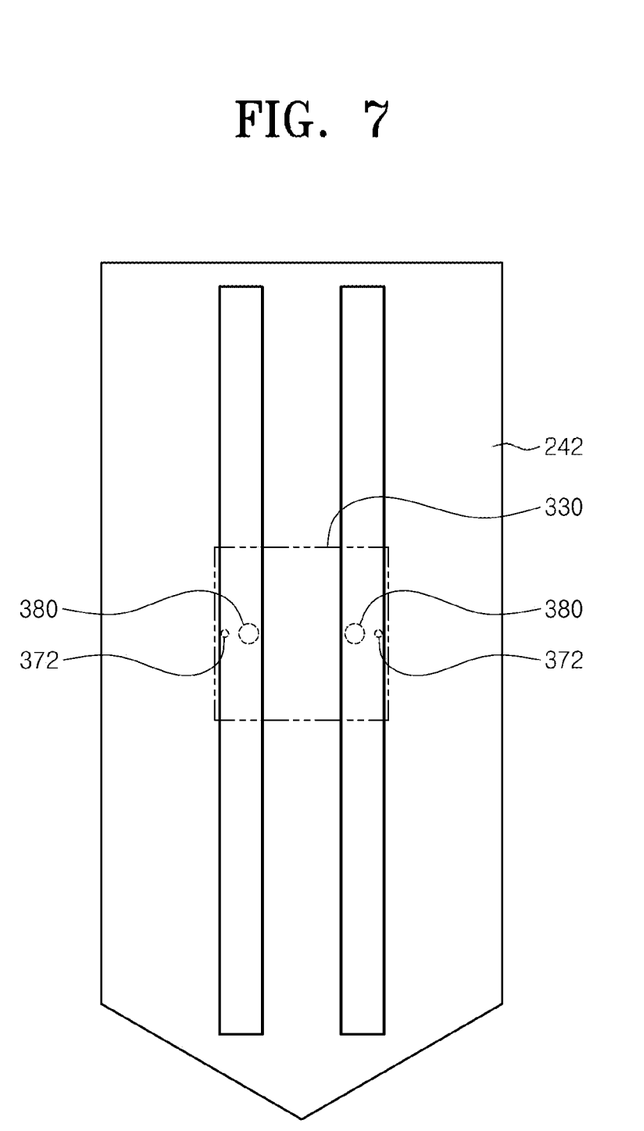
FIGS. 7 and 8 are views illustrating the positions of gas supply units and exhaust ports in the transfer chamber.
Figure 8:
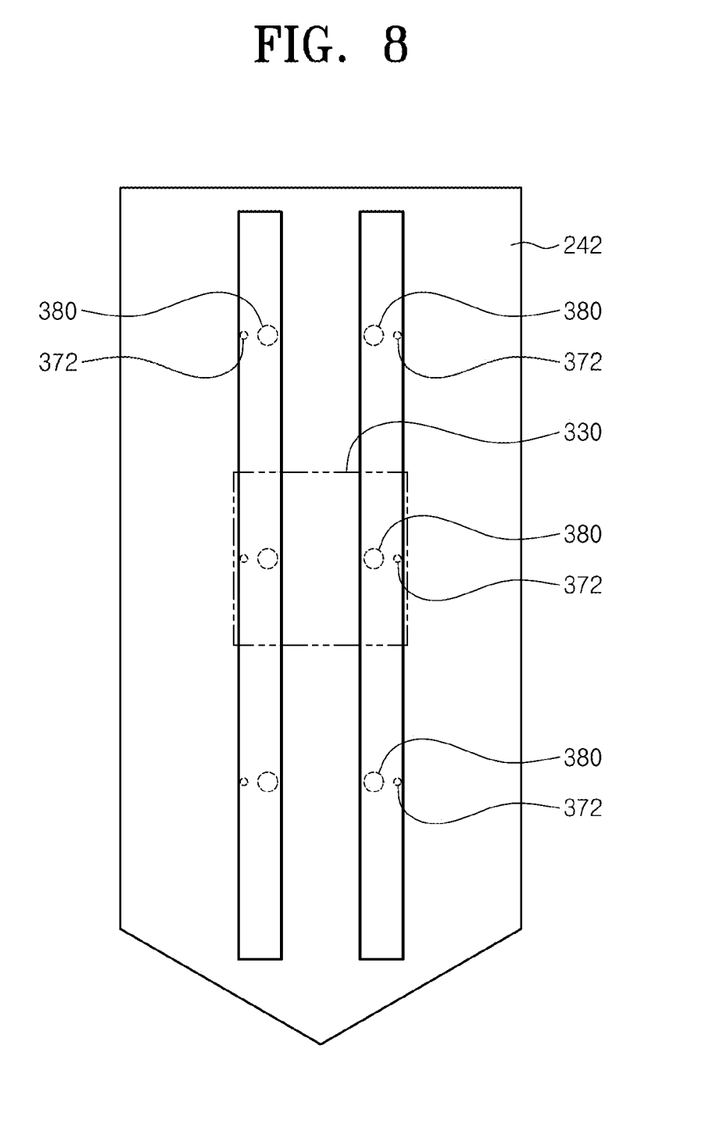

FIGS. 7 and 8 are views illustrating the positions of the gas supply units and the exhaust ports in the transfer chamber.

As illustrated in FIG. 7, the gas supply units 372 and the exhaust ports 380 may be provided below the central portion of the linear rail unit 320. Alternatively, as illustrated in FIG. 8, the gas supply units 372 and the exhaust ports 380 may be provided below opposite end portions and the central portion of the linear rail unit 320.

As described above, the gas supply units 372 and the exhaust ports 380 may be provided in one or more positions along the linear rail unit 320 as needed.

As described above, according to the embodiments, the inventive concept may minimize a poor process caused by particles generated in a process of transferring a substrate.

In addition, the inventive concept may minimize the release of particles generated in the transfer robot to the outside.

Effects of the inventive concept are not limited to the above-described effects. Any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. The drawings provided in the inventive concept are only drawings of the optimal embodiments of the inventive concept. The scope of the inventive concept should be determined by the technical idea of the claims, and it should be understood that the scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate transfer apparatus comprising:
a transfer robot;
a linear rail unit including a movable plate on which the transfer robot is mounted and a running shaft on which the movable plate travels; and
a particle diffusion reduction member configured to prevent diffusion of particles by maintaining a differential pressure between the movable plate and the running shaft,
wherein the particle diffusion reduction member includes:
a gas supply unit configured to supply an inert gas into a space between the movable plate and the running shaft;
an exhaust port configured to suction air around the running shaft from below the running shaft; and
a shielding cover member configured to prevent particles generated in the space between the movable plate and the running shaft and the inert gas supplied from the gas supply unit from diffusing to outside the shielding cover member,
wherein the gas supply unit includes a gas supply hole facing the shielding cover member.

2. The substrate transfer apparatus of claim 1, wherein the particle diffusion reduction member further includes:
a meandering gas passage provided in the space between the movable plate and the running shaft such that the inert gas supplied from the gas supply unit is released through the exhaust port.

3. The substrate transfer apparatus of claim 1, wherein the shielding cover member is installed with a same length as the running shaft.

4. The substrate transfer apparatus of claim 3, wherein the shielding cover member includes:
a lower cover provided between the running shaft and the gas supply unit; and
an upper cover configured to surround an outer side of the running shaft and a top side of the running shaft.

5. The substrate transfer apparatus of claim 4, wherein the lower cover and the upper cover provide a meandering gas passage in the space between the movable plate and the running shaft such that the inert gas supplied from the gas supply unit is released through the exhaust port.

6. A substrate transfer apparatus comprising:
a transfer robot;
a linear rail unit including a movable plate on which the transfer robot is mounted and a running shaft on which the movable plate travels; and
a particle diffusion reduction member configured to prevent diffusion of particles by maintaining a differential pressure between the movable plate and the running shaft,
wherein the particle diffusion prevention member includes:
a gas supply unit configured to supply an inert gas into a space between the movable plate and the running shaft; and
an exhaust port configured to suction air around the running shaft from below the running shaft,
wherein the article diffusion prevention member further includes:
a shielding cover member configured to prevent particles generated in the space between the movable plate and the running shaft and the inert gas supplied from the gas su ply unit from diffusing to outside the shielding cover member,
wherein the shielding cover member is installed with a same length as the running shaft,
wherein the shielding cover member includes:
a lower cover provided between the running shaft and the gas supply unit; and
an upper cover configured to surround an outer side of the running shaft and a top side of the running shaft,
wherein the lower cover and the upper cover provide a meandering as passage in the space between the movable plate and the running shaft such that the inert gas supplied from the gas supply unit is released through the exhaust port, and
wherein the movable plate includes slots through which the lower cover and the upper cover pass.

7. A substrate transfer apparatus comprising:
a transfer robot;
a linear rail unit including a movable plate on which the transfer robot is mounted and a running shaft on which the movable plate travels; and
a particle diffusion reduction member configured to prevent diffusion of particles by maintaining a differential pressure between the movable plate and the running shaft,
wherein the particle diffusion prevention member includes:
a gas supply unit configured to supply an inert gas into a space between the movable plate and the running shaft; and
an exhaust port configured to suction air around the running shaft from below the running shaft,
a shielding cover member configured to prevent particles generated in the space between the movable plate and the running shaft and the inert gas supplied from the gas supply unit from diffusing to outside the shielding cover member,
wherein the shielding cover member is installed with a same length as the running shaft,
wherein the shielding cover member includes:
a lower cover provided between the running shaft and the gas supply unit; and
an upper cover configured to surround an outer side of the running shaft and a top side of the running shaft,
wherein the lower cover and the upper cover provide a meandering gas passage in the space between the movable plate and the running shaft such that the inert gas supplied from the gas supply unit is released through the exhaust port,
wherein the movable plate includes:
a first slot arranged in a horizontal direction from a side surface of the movable plate;
a second slot arranged downward from an end of the first slot;
a third slot arranged downward from any position of the first slot that is spaced apart from the second slot by a predetermined distance;
a fourth slot arranged upward from a bottom surface of the movable plate and located between the second slot and the third slot; and
an axial groove arranged on the bottom surface of the movable plate, the running shaft being inserted into the axial groove.

8. The substrate transfer apparatus of claim 7, wherein the upper cover includes:
a first side plate located along a side surface of the running shaft;
a first upper plate extending from an upper end of the first side plate in the horizontal direction, the first upper plate being located in the first slot; and first and second bending plates extending downward from the first upper plate, the first and second bending plates being located in the second slot and the third slot, respectively.

9. The substrate transfer apparatus of claim 7, wherein the lower cover includes a third bending plate and a fourth bending plate vertically located in the fourth slot and the axial groove.

10. The substrate transfer apparatus of claim 9, wherein the gas supply unit is provided to supply the inert gas between the first bending plate and the third bending plate.

11. The substrate transfer apparatus of claim 7, wherein the exhaust port is provided to be located under the running shaft.

12. A substrate treating apparatus comprising:
a transfer chamber having a substrate transfer space surrounded by a floor and walls;
a transfer robot provided in the substrate transfer space;
a movable plate on which the transfer robot is mounted;
a linear rail on which the movable plate travels;
a shielding cover member along the linear rail and configured to surround the linear rail;
a gas supply port provided in the floor and configured to supply an inert gas into a space between the movable plate and the linear rail; and
an exhaust port provided in the floor and configured to suction air around the linear rail from below the linear rail,
wherein the gas supply port faces the movable plate or the shielding cover member.

13. The substrate treating apparatus of claim 12, wherein the linear rail is mounted on a support block provided on the floor and is spaced apart from the floor, and
wherein the exhaust port is located under the linear rail.

14. The substrate treating apparatus of claim 12, wherein the shielding cover member provides a meandering gas passage in the space between the movable plate and the linear rail such that the inert gas supplied from the gas supply port is released through the exhaust port.

15. The substrate treating apparatus of claim 12, wherein the substrate treating apparatus is configured to have two or more gas supply ports and two or more exhaust ports in different locations along the linear rail.

* * * * *